United States Patent
Huang

(10) Patent No.: US 6,268,283 B1
(45) Date of Patent: Jul. 31, 2001

(54) METHOD FOR FORMING DUAL DAMASCENE STRUCTURE

(75) Inventor: Yimin Huang, Taichung Hsien (TW)

(73) Assignee: United Microelectronics Corp., Hsinchu (TW)

(*) Notice: Subject to any disclaimer, the term of this patent is extended or adjusted under 35 U.S.C. 154(b) by 0 days.

(21) Appl. No.: 09/248,159

(22) Filed: Feb. 9, 1999

(51) Int. Cl.[7] ............ H01L 21/4763; H01L 21/311; H01L 21/302; H01L 21/461
(52) U.S. Cl. ............ 438/638; 438/622; 438/624; 438/637; 438/700; 438/734; 438/737
(58) Field of Search ............ 438/623, 624, 438/637, 638, 639, 640, 634, 666, 672, 622, 700, 701, 702, 734, 735, 736, 737, 738, 740, 618

(56) References Cited

U.S. PATENT DOCUMENTS 5,920,790 * 7/1999 Wetzel et al. ............ 438/618
6,057,239 * 5/2000 Wang et al. ............ 438/704
6,100,184 * 8/2000 Zhao et al. ............ 438/638

OTHER PUBLICATIONS

Ikeba et al, Integration of Organic Low-k Material with Cu-Damascene Employing Novel Process, Interconnect Technology Conference 1998, pp 131–133, Jun. 01, 1998.*

* cited by examiner

Primary Examiner—Charles Bowers
Assistant Examiner—Thanhha Pham

(57) ABSTRACT

An improved method for forming a dual damascene structure is described. A via opening of the dual damascene structure is formed in a dielectric layer. A non-conformal cap layer is then formed on the substrate before the step of defining the photoresist layer. The non-conformal cap layer only covers the top region of the trench but does not fill the trench. A patterned photoresist layer is then formed on the substrate followed by an etching procedure so as to form a trench. The photoresist layer is then removed. The trench and via opening are filled with a conductive layer. Thereafter, redundant portions of the conductive layer are removed by a planarization process.

18 Claims, 5 Drawing Sheets

METHOD FOR FORMING DUAL DAMASCENE STRUCTURE

BACKGROUND OF THE INVENTION

1. Field of the Invention

This invention relates to a method for fabricating multi-level interconnects, and more particularly, to a method for manufacturing a dual damascene structure.

2. Description of Related Art

As the initegration of a semiconductor device is increased, the resistance-capacitance dela resulting from the parasitic capacitance generated by an inter-metal dielectric layer is worsened. Hence, it is common to utilize a low-permittivity dielectric to form an inter-metal dielectric in a sub-micron semiconductor. In the damascene process, the low-permittivity dielectric layer is usually used to reduce interconnection parasitic capacitance, hence the operation speed is improved. Therefore, the low-permittivity dielectric layer is a very popular IMD material for use in high-speed integrated circuits (IC).

A dual damascene process is a technique which imbeds metal plugs into an insulator and forms an aluminum metal layer on the substrate to connect the metal plugs. The dual damascene process is a process for manufacturing metal lines with high reliability and low cost. Materials used in the interconnections are not limited by the etching process of the metal. As a result, the dual damascene structure has been widely used in the manufacturing process for copper conductive lines so that the resistance of the conductive line is reduced for increasing the operation speed and quality of the integrated circuit. As the integration of a semiconductor device is increased, the dual damascene structure using dielectric layers with low-permittivity is used more in the semiconductor processes for manufacturing metal interconnections.

FIGS. 1A through 1D are schematic, cross-sectional views showing a conventional method for fabricating a dual damascene structure.

Referring to FIG. 1A, a substrate 100 contains a metal layer 102 is provided. A dielectric layer 104, an etching stop layer 106 and a dielectric layer 108 are formed on a provided substrate 100, in sequence. A photoresist layer 110 is then formed on the dielectric layer 108. A conventional photolithography method is applied to pattern the photoresist layer 110 so as to form the pattern for a via opening.

Referring to FIG. 1B, the dielectric layer 108 etching stop layer 106 and dielectric layer 104 are etched to form the via opening 112 exposing the metal layer 102, with the patterned photoresist layer 110 serving as a mask. The photoresist layer 110 is then removed followed by the step of forming another photoresist layer 114 on the substrate 100. A conventional photolithography method is applied to pattern the photoresist layer 110, so as to form a trench pattern.

Referring to FIG. 1C. the dielectric layer 108 is then etched to form the trench 116, with the photoresist layer 108 and etching stop layer 108 serving as a mask and etching stop point, respectively. Thereafter, the photoresist layer 114 is removed. The trench 116 and via opening 112 are then filled with a metal layer 118 so that a dual damascene structure is formed, as shown in FIG. 1D.

As the integration of a semiconductor device is increased, the resistance-ecapacitance delay resulting from the parasitic capacitance generated by an inter-metal dielectric layer is worsened. Hence, it is common to utilize a low-permittivity dielectric to form an inter-metal dielectric in a sub-micron semiconductor fabrication process for reducing the Resistance-Capacitance Time Delay effect. Conventionally, the photoresist layer is composed of polymer materials and the low-permittivity dielectric also includes organic materials. However, the regions 120 of the dielectric layers 108 and 104 exposed in the via opening 112 may be damaged by the developer during the developing process of the photoresist layers 110 and 114. Therefore, the profile of the dual damascene is destroyed.

SUMMARY OF THE INVENTION

The invention provides an improved method for forming a dual damascene structure. The method includes forming a first dielectric layer, an etching stop layer, a second dielectric layer and a hard mask layer on the substrate. Parts of the hard mask layer, the second dielectric layer, the etching stop layer and the first dielectric layer are etched to form a via opening. A non-conformal cap dielectric layer is then formed on the hard mask layer to cover the top region of the via opening. A patterned photoresist layer is then formed on the non-conformal cap layer. Parts of the non-conformal cap layer hard mask layer and second dielectric layer are etched to form a trench by using the patterned photo-resist layer as an etching mask. The patterned photoresist layer and non-conformal cap layer are then removed. The trench and via opening are then filled with a layer of conductive material. A chemical mechanical polishing step is then performed to remove redundant portions of the conductive layer.

The cap layer is for example, composed of a material capable of preventing the damage in the developing step of the photoresist layer. Moreover, the first and second dielectric layers are protected in the developing step of the photoresist because the cap layer only covers the top region of the via opening. Therefore, the original profile of the via opening is maintained. The cap layer can be formed by a plasma enhanced chemical vapor deposition process. The cap layer includes silicon oxide, silicon nitride or silicon oxynitride. Furthermore, the cap layer can be removed easily using a dry etching.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

The invention provides a new fabricating method for a dual damascene structure as shown in FIGS. 2A through 2F.

Figure 1A:
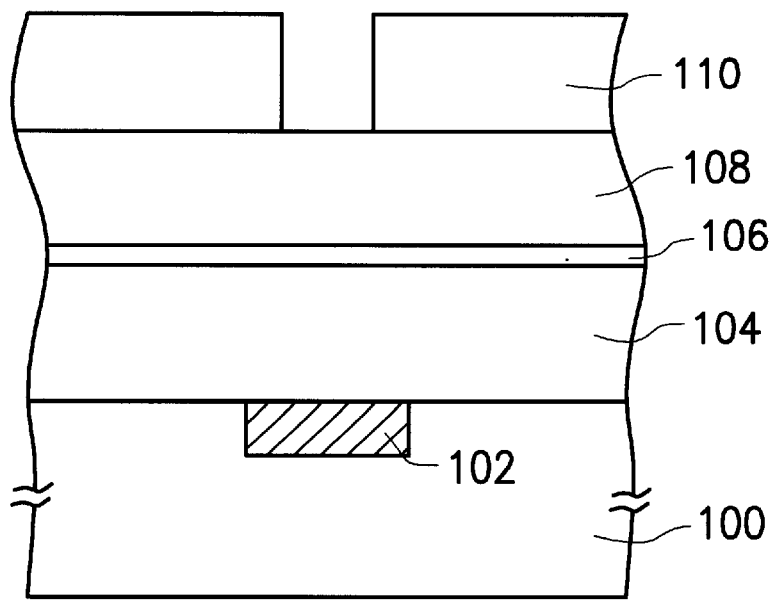
FIGS. 1A through 1D are schematic, cross-sectional views showing a conventional fabricating method of a dual damascene structure.
Figure 1B:
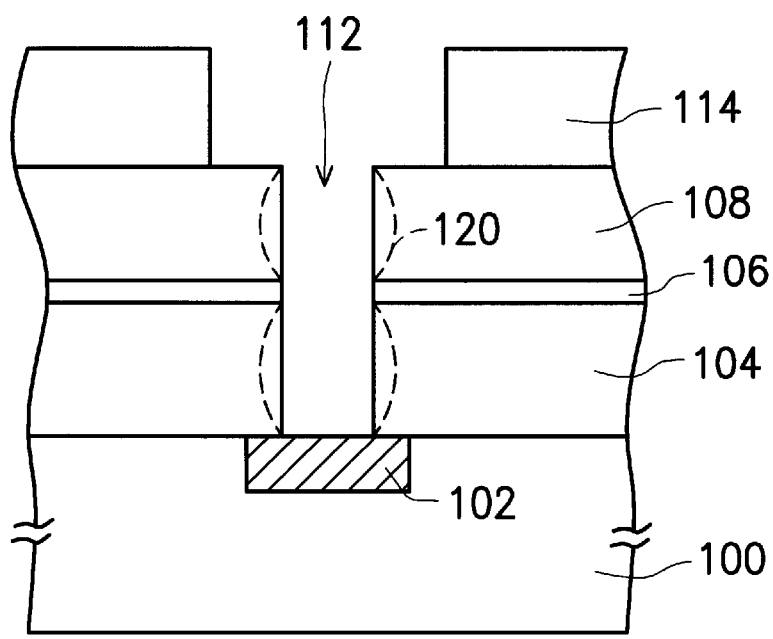
Figure 1C:
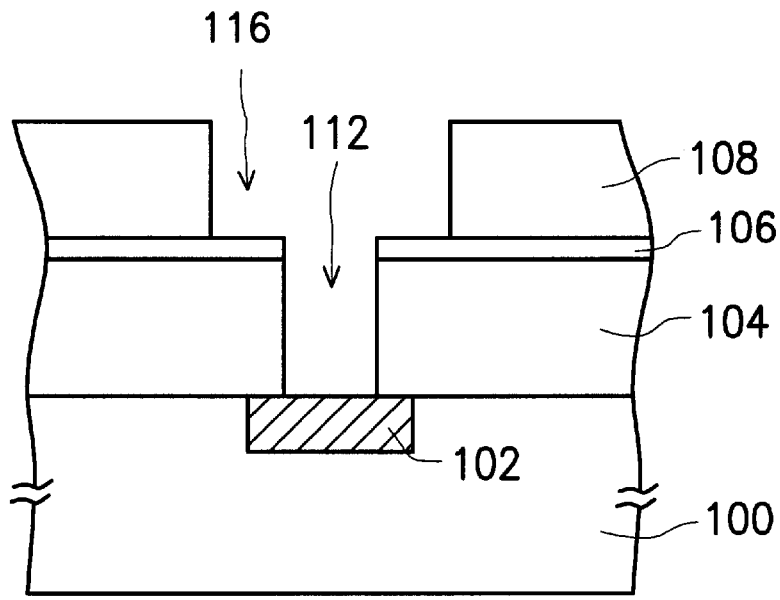
Figure 1D:
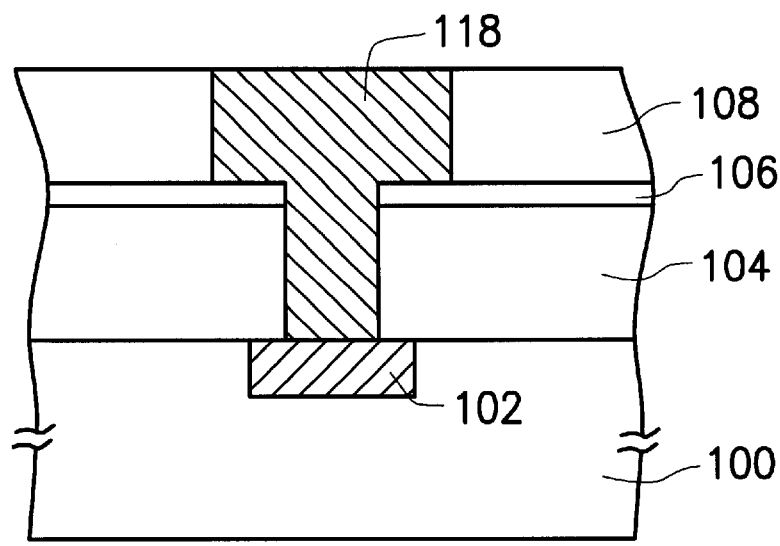
Figure 2A:
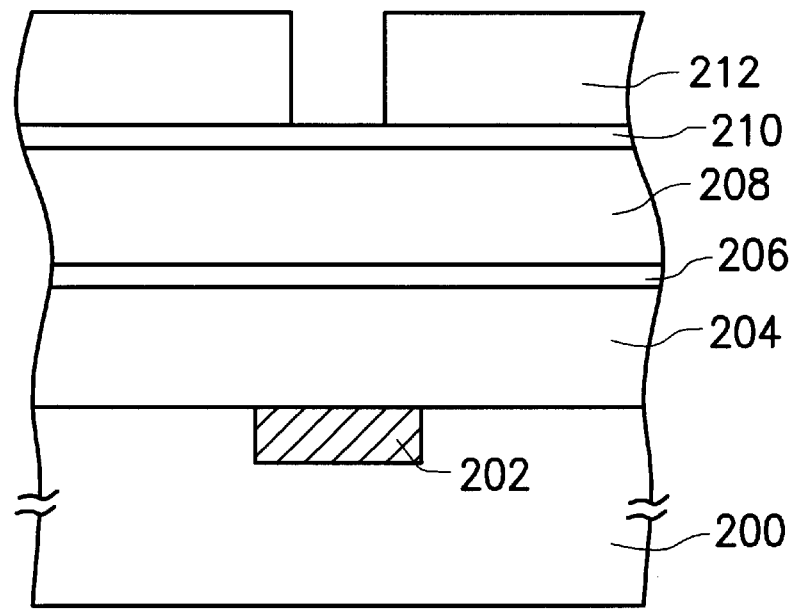
FIGS. 2A through 2F are schematic, cross-sectional views showing the fabricating method of a dual damascene structure in a preferred embodiment according to the invention.

Referring to FIG. 2A, a dielectric layer 204 is formed on a provided substrate 200. A planarization process is performed on the dielectric layer 204, so that the thickness of the remaining dielectric layer 204 is equal to the depth of a desired via plug to be formed in a follow-up process. On the top of the planarized dielectric layer 204, an etching stop layer 206 utilized as an etching stop point in a follow-up process and another dielectric layer 208 are deposited in sequence. A planarization process is also performed on the top surface of the dielectric layer 208 after the deposition process. The thickness of the dielectric layer 208 after the planarization process is about equal to the thickness of a conducting, wire of the desired dual damascene structure. A hard mask layer 210 is then formed on the dielectric layer 208.

The dielectric layers 204 and 208 are formed from low-permittivity spin-on organic polymer (SOP) such as Flare SILK Parylene or PAE-II. The dielectric layer 204 has a thickness of between about 6000 Å and 10000 Å. The dielectric layer 208 has a thickness of about 4000 Å and 6000 Å. The etching stop layer 206 has a thickness of between about 300 Å and 1000 Å and includes silicon nitride, silicon oxide or silicon oxynitride formed by a process such as chemical vapor deposition. The hard mask layer 210 includes silicon oxide, silicon nitride and silicon oxynitride formed by a process such as chemical vapor deposition. The hard mask layer 210 has a thickness of between about 300 Å and 1000 Å for preventing the low-level devices from being damaged by the developer in the follow-up developing process of a photoresist layer.

Referring still to FIG. 2A, a layer of photoresist is formed on the bard mask layer 210. A conventional photolithography technique is then applied to form a photoresist layer 212 having an opening pattern for the via. As described above, the hard mask layer 210 can prevent the low-level dielectric layer 208 from being damaged by the developer used in the photolithography process.

Figure 2B:
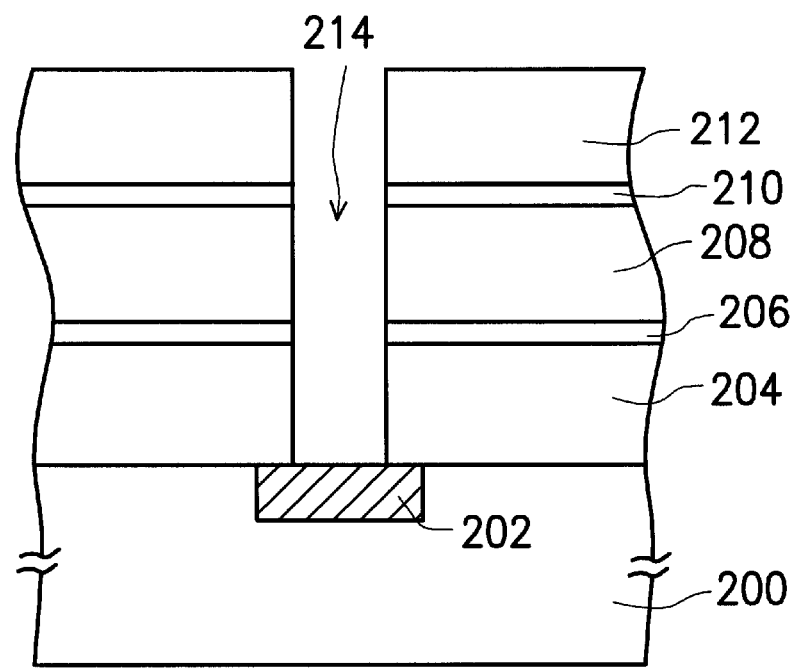

Referring to FIG. 2B. a via opening 214 is formed in the hard mask layer 210, dielectric layer 208, etching stop layers 206 and 204 by an etching process that used the photoresist layer 212 as an etching mask.

Figure 2C:
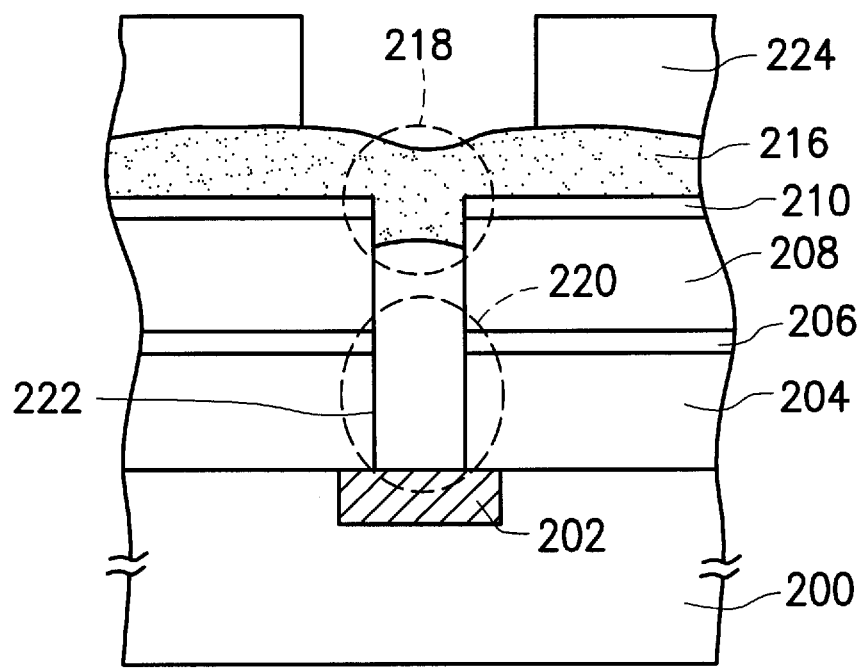

Referring to FIG. 2C, the photoresist layer 212 is removed. A cap layer 216 is then formed on the hard mask layer 210 by, for example, a plasma enhanced chemical vapor deposition, to a thickness of about 1000 Å to 2000 Å. The cap layer 216 is a key point of the present invention. The cap layer 216 is formed from materials, for example, silicon oxide, silicon nitride or silicon oxynitride, having the function of preventing the low-level devices from being damaged in the developing process. The cap layer 216 has a non-conformal shape and only covers the top region 218 of the via opening 214 as shown in FIG. 2C. The cap layer 216 does not fill or cover the sidewalls 222 of the via opening 214. The preferred method for forming the cap layer 216 includes plasma enhanced chemical vapor deposition.

Referring still to FIG. 2C, another layer of photoresist is formed on the cap layer 216. The conventional photolithography method is used for patterning the photoresist layer to form a photoresist layer 224 having trench pattern which is used for forming a trench on the dielectric layer 208 and hard mask layer 210. Because of the cap layer 216 formed on the top region 218 of the via opening 214, the dielectric layers 208 and 204 can be prevented from being damaged by developer.

Figure 2D:
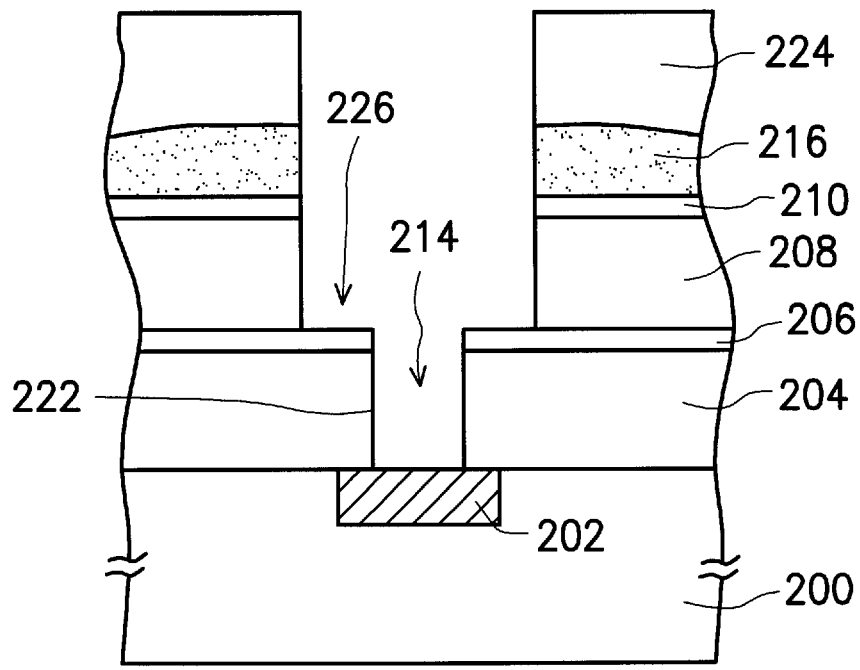

Referring to FIG. 2D, the cap layer 216 exposed by the photoresist layer 224 is etched by, for example a dry etching process that uses the photoresist layer 224 and etching stop layer 216 as etching mask and etching stop point, respectively. The hard mask layer 210 and the dielectric layer 208 formed below the cap layer 216 are then etched to form a trench 226 in the same etching process. Because the cap layer 216 only covers the top region 218 and does not cover the sidewalls 222 of the via opening 214, the cap layer 216 located on the top region 218 of the via opening 214 can be removed easily in the dry etching process.

Figure 2E:
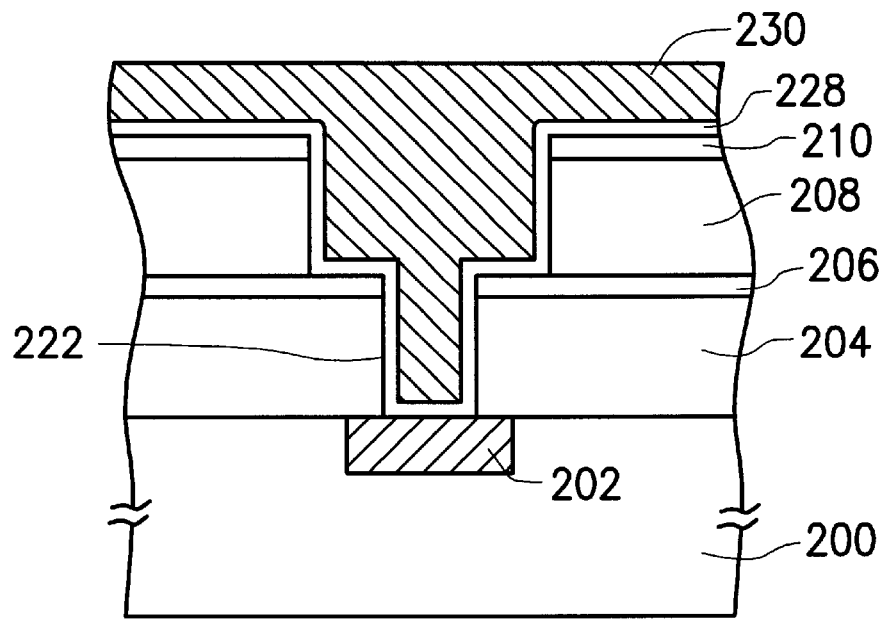
Figure 2F:
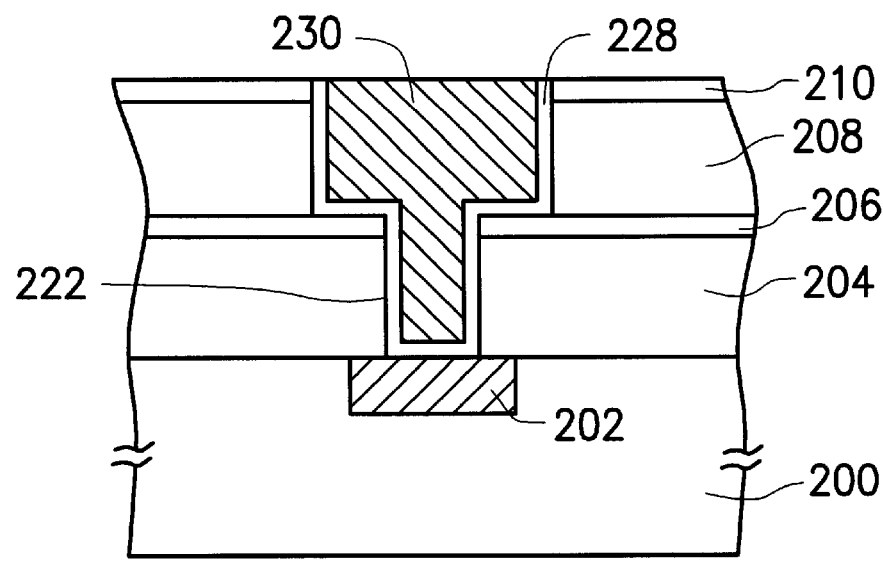

Referring to FIG. 2E, the photoresist layer 224 and cap layer 216 are removed entirely. The method used to remove the cap layer 216 is, for example, a dry etching method. A conductive layer 230) is then formed on the substrate 200 to a thickness sufficient to fill the via opening 214 and trench 226 by a process such as chemical vapor deposition or electroplating. The preferred material of the conductive layer 230 includes metal, for example, tungsten metal Another preferred method of the present invention is forming, a conformal glue or barrier layer 228 between the substrate 200 and conductive layer 230 for increasing the adhesion between conductive layer 230 and dielectric layers 208 and 204 and preventing the diffusion of metal ions from the conductive layer 230 into the dielectric layers 204 and 208. Formation of the barrier layer 228 avoids the reduced reliability problem. The glue and barrier layer 228 includes titanium/titanium nitride, tantalum, tantalum nitride, tungsten nitride, titanium nitride or tantalum-silicon-nitride (TaSiN). After the conductive layer 230 is formed, a chemical mechanical polishing process is next performed to remove the redundant portions of the conductive layer 230 and glue/barrier layer 228 as shown in FIG. 2F.

As described above, the feature of the invention is of the formation of a non-conformal cap layer which can be used to prevent the low-level dielectric layer from being damaged by the developer in the developing step of the photoresist layer. Therefore, the original profile of the via opening can be maintained. Furthermore, the cap layer only covers the top region but does not cover the sidewalls of the via opening. Therefore, the cap layer can be removed in the dry etching step during the defining of the trench.

Therefore, it is a specificity of the invention to suppress the parasitic capacitance of a semiconductor device for improving the performance of the device by utilizing low-permittivity dielectrics.

It is also a specificity of the invention to maintain the profiles of the via opening and trench of the dual damascene structure and to avoid damage in the photolithography process.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A method of forming a dual damascene structure in a low-permittivity dielectric layer, comprising:
    forming a first low-permittivity dielectric layer on a substrate;
    forming an etching stop layer on the first low-permittivity dielectric layer;
    forming a second low-permittivity dielectric layer on the etching stop layer;
    forming a hard mask layer on the second low-permittivity dielectric layer;
    forming a first patterned photoresist layer on the substrate;
    removing pairs of the hard mask layer, second low-permittivity dielectric layer, etching stop layer and first low-permittivity dielectric layer to form a opening by using the first patterned photoresist layer as a mask;
    removing the first patterned photoresist layer;
    forming, a non-conformal cap layer on the hard mask layer to cover the top region of the openings forming a second patterned photoresist layer on the non-conformal layer;

removing parts of the non-conformal cap layer, hard mask layer and second low-permittivity dielectric layer to form a trench;

removing the second patterned photoresist layer;

removing the non-conformal cap layer; and filling the opening and trench with a conductive material.

2. The method of claim 1, wherein the first and second low-permittivity dielectric layers includes a spin-on polymer.

3. The method of claim 2, wherein the spin-on polymer is selected from an organic group consisting, of Flare, SILK. Paryiene and PAE-II.

4. The method of claim 1, wherein the step of forming a cap layer includes using a plasma enhanced chemical vapor deposition process.

5. The method of claim 1, wherein the non-conformal cap layer includes a material that can prevent damage from occurring in developing steps of the first and second patterned photoresist layers.

6. The method of claim 5, wherein the material of the non-conformal cap layer includes a silicon oxide, a silicon nitride or a silicon oxynitride layer formed by a plasma enhanced chemical vapor deposition process.

7. The method of claim 1, wherein the step of removing the non-conformal cap layer includes using a dry etching process.

8. A method for manufacturing a dual damascene structure, comprising;

providing a substrate, wherein the substrate further comprises a dielectric layer having an opening;

forming a non-conformal cap layer on a top region of the opening such that the opening is partially filled, wherein the non-conformal cap layer includes a material that can prevent damage from a developer in a following patterning step;

forming a photoresist layer on the non-conformal cap layer;

patterning the photoresist layer to form a patterned photoresist layer;

removing parts of the non-conformal cap layer and the dielectric layer to form a trench by using the patterned photoresist layer as a mask;

removing the patterned photoresist layer;

removing the non-conformal cap layer; and filling the opening and trench with a conductive layer.

9. The method of claim 8, wherein the dielectric layer includes low-permittivity materials.

10. The method of claim 8, wherein the dielectric layer includes a spin-on polymer.

11. The method of claim 10, wherein the spin-on polymer is selected from the group consisting of Flare, SILK, Parylene and PAE-II.

12. The method of claim 8, wherein the step of forming a cap layer includes using a plasma enhanced chemical vapor deposition process.

13. The method of claim 8, wherein the non-conformal cap layer includes a silicon oxide formed by a plasma enhanced chemical vapor deposition process.

14. The method of claim 8, wherein the non-conformal cap layer includes a silicon nitride formed by a plasma enhanced chemical vapor deposition process.

15. The method of claim 8, wherein the non-conformal cap layer includes a silicon oxynitride formed by a plasma enhanced chemical vapor deposition process.

16. The method of claim 8, wherein the step of removing the non-conformal cap layer includes using a dry etching process.

17. A method for forming an opening, used on a substrate having a dielectric layer with low-permittivity formed thereon, the dielectric layer further comprising a first opening, the method comprising:

forming a non-conformal cap layer on the dielectric layer to cover a top region of the first opening, such that the first opening is partially filled, wherein the non-conformal cap layer includes a material that can prevent damage from a developer in a following patterning step;

forming a photoresist layer on the non-conformal cap layer;

patterning the photoresist layer to form a patterned photoresist layer;

removing parts of the non-conformal cap layer and the dielectric layer to form a second opening; and removing the patterned photoresist layer.

18. The method of claim 17, wherein the non-conformal cap layer is formed by a plasma enhanced chemical vapor deposition process.

* * * * *